United States Patent [19]

Itozaki et al.

[11] Patent Number: 5,372,992
[45] Date of Patent: Dec. 13, 1994

[54] SUPERCONDUCTING THIN FILM

[75] Inventors: Hideo Itozaki; Kenjiro Higaki; Shuji Yazu, all of Hyogo, Japan

[73] Assignee: Sumitomo Electric Industries, Ltd., Osaka, Japan

[21] Appl. No.: 176,683

[22] Filed: Jan. 3, 1994

Related U.S. Application Data

[63] Continuation of Ser. No. 46,914, Mar. 15, 1994, abandoned, which is a continuation of Ser. No. 609,786, Nov. 7, 1990, abandoned.

[30] Foreign Application Priority Data

Nov. 7, 1989 [JP] Japan .................. 1-289661

[51] Int. Cl.$^5$ .................................. B32B 9/00
[52] U.S. Cl. ......................... 505/238; 505/701; 505/237; 505/239; 428/688; 428/700; 428/701; 428/930
[58] Field of Search ............. 505/701, 237, 239, 238; 428/688, 700, 701, 930

[56] References Cited

U.S. PATENT DOCUMENTS 4,948,779 8/1990 Keur et al. .................. 505/1
5,024,898 6/1991 Chien .......................... 505/701

FOREIGN PATENT DOCUMENTS 0301646 1/1989 European Pat. Off. .
0306287 8/1989 European Pat. Off. .
0400524 5/1990 European Pat. Off. .
8908335 8/1989 WIPO .

OTHER PUBLICATIONS

Williams et al in "Chemistry of High T Superconductors II", ACS 1988, ch. 22 pp. 291-302.
Guritch et al. "A metal alloy process for the formation of oxide superconducting films, Advantages, Problems Substrate Interactions, Buffer layers", Materials Rsch Soc. Symposium Proceeding, vol. 99 1988.
Yoshiara et al., "Superconductivity of Screen Printed $YBa_2Cu_3O_y$ Thick Films in $Y_2BaCuO_5$ Substrates" Jap. Jour. of App. Phys. vol. 27 No. 8 Aug 1988 pp L1492-L1494.
Sahu, et al., "Overview of High Tc Superconductivity" in Chemistry of High Temperature Superconductors II, ACS 1988.
Gurvitch et al, in "High-Temperature Superconductors," M Brodsky, ed. Materials Research Society: Pittsburgh, 1988 (originally presented at symposium in Boston, held Nov. 30, 1987–Dec. 4, 1987).
Superconductivity of Screen Printed $YBa_2Cu_3O_y$ Thick Films on $Y_2BaCuO_5$ Substrates, Jap. Journ. Appl. Phy., vol. 27, No. 8, (Aug. 1988), pp. 1492-1494.
Dorris et al article, Japanese Journal of Applied Physics vol. 28, No. 8, Aug. 1989.

Primary Examiner—Patrick J. Ryan
Assistant Examiner—Patrick Jewik
Attorney, Agent, or Firm—Kerkam, Stowell, Kondracki & Clarke

[57] ABSTRACT

A superconducting thin film of a compound oxide represented by $YBa_2Cu_3O_y$ in which "y" is a number of $6<y<8$ and deposited on a substrate, characterized in that a buffer layer of a compound oxide represented by $Y_2BaCuO_x$ in which "x" is a number of $4<x<6$ is interposed between the superconducting thin film and the substrate.

3 Claims, No Drawings

SUPERCONDUCTING THIN FILM

This application is a continuation of application Ser. No. 08/046,914, filed Mar. 15, 1993, now abandoned, which is a continuation of application Ser. No. 07/609,786, filed Nov. 7, 1990, now abandoned.

BACKGROUND OF THE INVENTION

1. Field of the Invention

The present invention relates to a superconducting thin film of deposited on a substrate, more particularly to a novel buffer layer 10 interposed between a superconducting thin film of $YBa_2Cu_3O_{7-\delta}$ and a substrate.

2. Description of the Related Art

Superconductivity have been thought, for a long time, to be a phenomenon observable at ultra-low temperatures realized with liquid helium as a cryogen. However, the possibility of an existence of a new type of superconducting material was revealed by Bednorz and Müller, who discovered $(La, Sr)_2CuO_4$ which exhibit the superconductivity at 30K in 1986 (Z. Phys. B64, 1986 p 189). C. W. Chu et al. discovered, in the United States of America, another superconducting material of $YBa_2Cu_3O_{7-\delta}$ having the critical temperature of about 90K in 1987 (Physical Review letters. Vol. 58. No. 9, p 908). Maeda et al discovered so-called bismuth type superconducting material (Japanese journal of Applied Physics. Vol. 27, No. 2. p 1209 to 1210). And hence, the possibility of an actual utilization of high-Tc superconductors have burst onto the scene.

The above-mentioned new type superconducting materials were obtained in a form of sintered mass prepared by powder metallurgy. The sintered mass, however, showed rather poor superconducting properties, particularly lower critical current density (Jc).

In order to increase the critical current density (Jc), a variety of thin film forming processes of these materials have been studied. Superconducting thin films of these compound oxides can be prepared by a variety of vapour deposition techniques such as vacuum-evaporation, sputtering, molecular beam epitaxy (MBE) on single crystal substrates such as $SrTiO_3$, MgO or the like. Remarkable improvement in the critical current density of these compound oxides have been achieved in their thin films. Their critical current densities, however, are not yet sufficiently high as to be utilizable in actual uses.

In order to increase the critical current density which is requested for fabricating superconducting devices, it is indispensable to prepare a thin film composed mainly of a single crystal at a large area on a substrate. Such large single crystal of superconducting oxide, however, can't be produced easily on a substrate by the present technology.

Still more, so-called post deposition annealing operation is indispensable in order to realize effective superconductivity in oxide thin films prepared by known vapour deposition methods. However, it is known that the post deposition annealing operation cause diffusion or migration of substrate material into the thin film, so that the quality of superconducting property of the thin film is sharply deteriorated in the neighborhood of an interface between the substrate and the thin film.

An object of the present invention is to solve the above-mentioned problems and to provide a novel buffer layer to be interposed between a superconducting thin film of $YBa_2Cu_3O_{7-\delta}$ and a substrate, which is effective to improve the quality of the superconducting thin film.

SUMMARY OF THE INVENTION

The present invention provides a superconducting thin film of a compound oxide represented by $YBa_2Cu_3O_y$ in which "y" is a number of $6<y<8$ and deposited on a substrate, characterized in that a buffer layer of a compound oxide represented by $Y_2BaCuO_x$ in which "x" is a number of $4<x<6$ is interposed between the superconducting thin film and the substrate.

An essence of the present invention resides in that the buffer layer is composed of the same constituent elements of Y, Ba and Cu as the superconducting thin film but atomic ratios of Y:Ba:Cu in this buffer layer is 2:1:1 which is different from atomic ratios of Y:Ba:Cu=1:2:3 in the superconducting thin film.

It is believed that crystal growth of $YBa_2Cu_3O_y$ in its superconducting thin film is attributed mainly to such an inherent property of this oxide that it is easily crystallized. In fact, the superconducting thin film of $YBa_2Cu_3O_y$ can be grown on a MgO substrate in spite of mismatching in lattice constant of 9.2% between the thin film and the substrate. However, such desirable inherent property of $YBa_2Cu_3O_y$ is spoiled by the post deposition annealing which cause migration or diffusion of substrate elements into the superconductive $YBa_2Cu_3O_y$. In other words, the superconducting thin film looses an effective crystalline structure which contribute the superconducting phenomenon by the post deposition annealing. According to the present invention, in order to solve this problem the superconductive $YBa_2Cu_3O_y$ is separated from the substrate by the buffer layer of the same compound oxide of Y-Ba-Cu as the superconducting thin film.

$Y_2BaCuO_x$ which is the buffer layer according to the present invention has a very good crystallinity and forms a perovskite structure on MgO substrate with high reproducibility. And hence, it is easy to deposit the superconducting thin film of the superconductive $YBa_2Cu_3O_y$ of well crystallized structure on this buffer layer. Still more, this buffer layer of $Y_2BaCuO_x$ according to the present invention is a very stable compound, so that migration or diffusion into the superconducting thin film during the post deposition annealing is reduced, and if elements of the buffer layer diffuse or migrate into the superconducting thin film, bad influence caused by the diffusion or migration is minimized because the buffer layer is composed of the same elements as the superconducting thin film. In other words, contamination of the superconducting thin film caused by the migration or diffusion of the buffer layer is prevented and an effective thickness of the superconducting thin film is increased.

In order to realize a desired crystal structure of $Y_2BaCuO_x$ in the buffer layer and to assure prevention of migration or diffusion from the substrate to the superconducting thin film, the buffer layer has preferably a thickness more than 100 Å.

The substrate is preferably selected from oxides such as $ZrO_2$, MgO, $SrTiO_3$, yttrium stabilized zirconia (YSZ), $LaGaO_3$, $NdGaO_3$ and $LaAlO_3$. These oxides are preferably single crystal oxides. The buffer layer is preferably deposited on {100} plane or {110} plane of these oxide substrates.

The buffer layer according to the present invention can be prepared by physical vapor deposition technique (PVD) such as sputtering, ion plating and molecular beam epitaxy (MBE) or by chemical vapor deposition (CVD) such as thermal CVD, plasma CVD, photo CVD and MOCVD. The superconducting thin film also can be prepared by the same PVD or CVD as above. Both of the buffer layer and the superconducting thin film can be prepared by using usual sputtering operational conditions of which are well-known.

In conclusion, the present invention provides a well-crystallized superconducting thin film of high-quality which is little influenced by migration of substrate material into the superconducting thin film and which is homogeneous in a direction of thickness Now, the present invention will be described with reference to an example, but the scope of the present invention should not be limited thereto.

EXAMPLE 1

Both of a buffer layer and a superconducting thin film were prepared by sputtering in the presence of ozone gas ($O_3$).

At first, a buffer layer of $Y_2BaCuO_x$ was deposited on a {100} plane of a single crystal of MgO substrate (10×10 mm) under operational conditions shown in Table 1 (1).

TABLE 1 (1)

| Operational conditions for depositing a buffer layer of $Y_2BaCuO_x$ | |
|---|---|
| Composition of a target used | Y:Ba:Cu = 2:1:2 |
| Sputtering gas | Ar + $O_3$ |
|  | $O_3$/Ar + $O_3$ = 0.2 vol % |
| Gas pressure | 4 × $10^{-2}$ Torr |
| Substrate temperature | 750° C. |
| High-frequency power | 50 W |
|  | 0.64 W/cm$^2$ |
| Film thickness | 100 Å |

The resulting buffer layer was analyzed by a X-ray diffraction analyzer (Rigaku Denki Co., Ltd) with $K\alpha$ of Cu to confirmed that the buffer layer has a composition of $Y_2BaCuO_5$.

Then, a superconducting thin film of $YBa_2Cu_3O_y$ was deposited on the resulting buffer layer of $Y_2BaCuO_5$ under operational conditions shown in Table 1 (2).

TABLE 1 (2)

| Operational conditions for depositing a superconducting thin film layer of $YBa_2Cu_3O_y$ | |
|---|---|
| Composition of a target used | Y:Ba:Cu = 1:2:4 |
| Sputtering gas | Ar + $O_3$ |
|  | $O_3$/Ar + $O_3$ = 0.2 vol % |
| Gas pressure | 4 × $10^{-2}$ Torr |
| Substrate temperature | 750° C. |
| High-frequency power | 50 W |
|  | 0.64 W/cm$^2$ |
| Film thickness | 3,000 Å |

The resulting superconducting thin film layer was analyzed by a X-ray diffraction analyzer (Rigaku Denki Co., Ltd) with $K\alpha$ of Cu to confirmed that the superconducting thin film layer has a composition of $YBa_2Cu_3O_7$.

For comparison, the same procedure as above was repeated to prepare another thin film of $YBa_2Cu_3O_y$ deposited directly on MgO substrate without the buffer layer of the present invention.

The critical temperature (Tco, Tci) and the critical current density (Jc) determined by usual methods are summarized in Table 2.

TABLE 2

|  | Critical temperature (K.) | | Critical current density (A/cm$^2$) |
|---|---|---|---|
|  | Tco | Tci |  |
| Invention | 90 | 89 | 2.5 × $10^6$ |
| Comparative | 91 | 84 | 0.5 × $10^6$ |

Note:
Tco: a temperature where electric resistance start to drop.
Tci: a temperature where electric resistance could not be measured
Critical current density was determined at 77 K.

Crystallinity of the thin film in the present invention and in comparative example were evaluated by a X-ray diffraction analysis and by a reflective high energy electron diffraction (RHEED) analyzer to find that both thin films were well-crystallized films of good quality.

Such a big difference in the critical current density as is shown in Table 2 can be explained from such understanding that, in the comparative example, magnesium (Mg) of the substrate migrated into the superconducting thin film and deteriorated the superconducting thin film in the neighborhood of an interface between the superconducting thin film and the substrate, so that an effective thickness of the superconducting thin film was reduced.

The same result of this example is obtainable by the other film forming methods than sputtering.

What is claimed is:

1. A superconducting thin film of a compound oxide represented by $YBa_2Cu_3O_y$, in which "y" is a number in the range of $6<y<8$ and deposited on a single crystal substrate, wherein a thin film buffer layer of a compound oxide represented by $Y_2BaCuO_x$, in which "x" is a number in the range of $4<x<6$, is interposed between said superconducting thin film and said substrate, wherein said buffer layer has a thickness greater than 100 Å and wherein said substrate is made of an oxide selected from the group consisting of $ZrO_2$, MgO, $SrTiO_3$, yttrium stabilized zirconia (YSZ), $LaGaO_3$, $NdGaO_3$ and $LaAlO_3$, and wherein said substrate is a single crystal substrate of oxide, and wherein said buffer layer is deposited on {100} plane or (110) plane of said substrate.

2. The superconducting thin film set forth in claim 1 wherein said buffer layer is prepared by sputtering.

3. The superconducting thin film set forth in claim 1 wherein said substrate is made from an oxide selected from the group consisting of $LaGaO_3$, $NdGaO_3$ and $LaAlO_3$.

* * * * *

UNITED STATES PATENT AND TRADEMARK OFFICE
CERTIFICATE OF CORRECTION

PATENT NO. : 5,372,992

DATED : December 13, 1994

INVENTOR(S) : ITOZAKI et al

It is certified that error appears in the above-indentified patent and that said Letters Patent is hereby corrected as shown below:

Title page,

Related U.S. Application Data [63] "Continuation of Ser. No. 46,914, Mar. 15, 1994," should be --Continuation of Ser. No. 46,914, Mar. 15, 1993--.

Signed and Sealed this

Eighteenth Day of April, 1995

*Attest:*

BRUCE LEHMAN

*Attesting Officer*  *Commissioner of Patents and Trademarks*